(12) United States Patent
Misaki

(10) Patent No.: US 7,304,350 B2
(45) Date of Patent: Dec. 4, 2007

(54) THRESHOLD VOLTAGE CONTROL LAYER IN A SEMICONDUCTOR DEVICE

(75) Inventor: Makoto Misaki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/410,047

(22) Filed: Apr. 25, 2006

(65) Prior Publication Data

US 2007/0054456 A1    Mar. 8, 2007

(30) Foreign Application Priority Data

Sep. 5, 2005    (JP) ............................. 2005-256031

(51) Int. Cl.
*H01L 29/94* (2006.01)

(52) U.S. Cl. .................. 257/344; 257/408; 257/653; 257/657; 257/927; 257/E29.005

(58) Field of Classification Search ............ 257/344, 257/402–404, 408, 653, 657, 927, E29.005; 438/217, 289, 291

See application file for complete search history.

(56) References Cited

U.S. PATENT DOCUMENTS

| 5,512,770 | A | * | 4/1996 | Hong ........................ 257/345 |
| 5,763,921 | A | * | 6/1998 | Okumura et al. ............ 257/371 |
| 5,929,495 | A | * | 7/1999 | Dennison et al. ........... 257/392 |
| 6,025,232 | A | * | 2/2000 | Wu et al. .................... 438/270 |
| 6,081,007 | A | * | 6/2000 | Matsuoka .................... 257/285 |
| 6,297,132 | B1 | * | 10/2001 | Zhang et al. ............... 438/514 |

(Continued)

FOREIGN PATENT DOCUMENTS

JP        2000-208605 A      7/2000

OTHER PUBLICATIONS

Quirk et al., "Characteristics of Semiconductor Materials," Semiconductor Manufacturing Technology, Prentice Hall, 2001, pp. 33-39.*

*Primary Examiner*—Zandra V. Smith
*Assistant Examiner*—Toniae M Thomas
(74) *Attorney, Agent, or Firm*—McDermott Will & Emery LLP

(57) ABSTRACT

A semiconductor device has a well region having a first conductivity type and formed in an upper portion of a semiconductor substrate, a gate insulating film and a gate electrode formed successively on the well region of the semiconductor substrate, a threshold voltage control layer for controlling a threshold voltage formed in the portion of the well region which is located below the gate electrode and in which an impurity of the first conductivity type has a concentration peak at a position shallower than in the well region, an extension region having a second conductivity type and formed in the well region to be located between each of the respective portions of the well region which are located below the both end portions in the gate-length direction of the gate electrode and the threshold voltage control layer, and source and drain regions each having the second conductivity type and formed outside the extension layer in connected relation thereto. The junction surface between the threshold voltage control layer and the extension region has an upwardly protruding configuration.

5 Claims, 3 Drawing Sheets

U.S. PATENT DOCUMENTS

| | | | |
|---|---|---|---|
| 6,383,876 B1 * | 5/2002 | Son et al. | 438/289 |
| 6,667,200 B2 * | 12/2003 | Sohn et al. | 438/199 |
| 6,764,909 B2 * | 7/2004 | Salling et al. | 438/289 |
| 6,797,576 B1 * | 9/2004 | Teng et al. | 438/305 |
| 6,872,640 B1 * | 3/2005 | Mouli | 438/514 |
| 6,927,137 B2 * | 8/2005 | Chakravarthi et al. | 438/289 |
| 7,129,533 B2 * | 10/2006 | Weber et al. | 257/285 |
| 2003/0235990 A1 * | 12/2003 | Wu | 348/694 |
| 2006/0154428 A1 * | 7/2006 | Dokumaci | 438/302 |

* cited by examiner

DEPTH FROM SUBSTRATE SURFACE

THRESHOLD VOLTAGE CONTROL LAYER IN A SEMICONDUCTOR DEVICE

CROSS-REFERENCE TO RELATED APPLICATIONS

The teachings of Japanese Patent Application JP 2005-256031, filed Sep. 5, 2005, are entirely incorporated herein by reference, inclusive of the claims, specification, and drawings.

BACKGROUND OF THE INVENTION

The present invention relates to a semiconductor device and a method for fabricating the same and, more particularly, to a MIS (metal insulator semiconductor) transistor having an extension structure and further having an LDD (lightly doped drain) structure in the source and drain regions thereof.

In recent years, MIS-type analog-digital mixed LSIs (large scale integrated circuits) have been used to control electronic equipment. To provide a MIS-type analog-digital mixed LSI featuring higher-speed operation and higher integration, a CMIS (complementary MIS) analog circuit technology has been becoming important.

In a CMIS analog circuit, the current gain gradually attenuates as the operational frequency is increased during RF operation so that it is effective to hold the current gain of the transistor high for a higher-speed operation.

In a semiconductor device disclosed in Japanese Laid-Open Patent Publication No. 2000-208605, an implantation region (hereinafter referred to as a pocket implantation region) having a polarity opposite to that of an LDD structure is provided under the LDD structure, thereby increasing the output impedance and improving the current gain.

To improve the current gain, it is effective to form a shallow LDD region and thereby completely deplete even the portion of a channel region in a semiconductor substrate which is located below the drain-side end portion of a gate electrode.

However, since an impurity is normally implanted into the pocket implantation region by using the gate electrode as a mask, it is difficult to implant the impurity into a shallow portion below the end portion of the gate electrode such that the conductivity type of the LDD region is cancelled out. Accordingly, the problem is encountered that complete depletion is hard to achieve.

SUMMARY OF THE INVENTION

In view of the conventional problem described above, it is therefore an object of the present invention to improve the current gain by completely depleting the portion of the channel region which is located below the drain-side end portion of the gate electrode without providing the pocket implantation region.

To attain the object, the present invention provides a semiconductor device with a structure in which the junction surface between a threshold voltage control layer formed in the channel region below the gate electrode and an extension region (LDD region) extending from each of the source and drain regions to a portion below the gate electrode has an upwardly protruding configuration.

Specifically, a semiconductor device according to the present invention comprises: a well region having a first conductivity type and formed in an upper portion of a semiconductor substrate; a gate insulating film and a gate electrode formed successively on the well region of the semiconductor substrate; a threshold voltage control layer for controlling a threshold voltage, the threshold voltage control layer being formed in the portion of the well region which is located below the gate electrode and in which an impurity of the first conductivity type has a concentration peak at a position shallower than in the well region; an extension region having a second conductivity type and formed in the well region to be located between each of the respective portions of the well region which are located below the both end portions in a gate-length direction of the gate electrode and the threshold voltage control layer; and source and drain regions each having the second conductivity type and formed outside the extension layer in connected relation thereto, wherein a junction surface between the threshold voltage control layer and the extension region has an upwardly protruding configuration.

In the semiconductor device according to the present invention, instead of the pocket implantation region provided under the extension region, the threshold voltage control layer is formed to maintain an impurity concentration which provides a desired threshold voltage at the surface of a channel under a gate insulating film, while having a concentration peak at a slightly deeper position. As a result, the enlargement of the extension region can be suppressed and even the portion of the channel region which is located below the drain-side end portion of the gate electrode is completed depleted. This allows the suppression of variations in channel length and increases the absolute value of an early voltage so that a high current gain is obtainable.

In the semiconductor device according to the present invention, the impurity of the first conductivity type to be doped into the threshold voltage control layer is preferably arsenic and an impurity of the second conductivity type to be doped into the extension region is preferably boron.

In the semiconductor device according to the present invention, the impurity of the first conductivity type to be doped into the threshold voltage control layer is preferably indium and an impurity of the second conductivity type to be doped into the extension region is preferably phosphorus.

In the semiconductor device according to the present invention, the junction between the threshold voltage control layer and the extension region below each of the both ends of the gate electrode is preferably at a depth shallower than the peak position of the impurity concentration in the threshold voltage control layer.

A method for fabricating a semiconductor device according to the present invention comprises the steps of: ion implanting an impurity of a first conductivity type into an upper portion of a semiconductor substrate to form a well region having the first conductivity type; implanting an impurity of the first conductivity type into the well region of the semiconductor substrate to form a threshold voltage control layer in which the implanted impurity has a concentration peak shallower than in the well region; successively forming a gate insulating film and a gate electrode on the threshold voltage control layer in the semiconductor substrate; and ion implanting an impurity of a second conductivity type into the threshold voltage control layer by using the gate electrode as a mask to form an extension region below each of both end portions in a gate-length direction of the gate electrode such that a junction surface between the extension region and the threshold voltage control layer has an upwardly protruding configuration.

In the method for fabricating a semiconductor device according to the present invention, in the step of forming the extension region, the junction between the extension region and the threshold voltage control layer below each of the both end portions of the gate electrode is preferably formed at a depth shallower than the peak position of the impurity concentration in the threshold voltage control layer.

DESCRIPTION OF THE PREFERRED EMBODIMENTS

Figure 1:
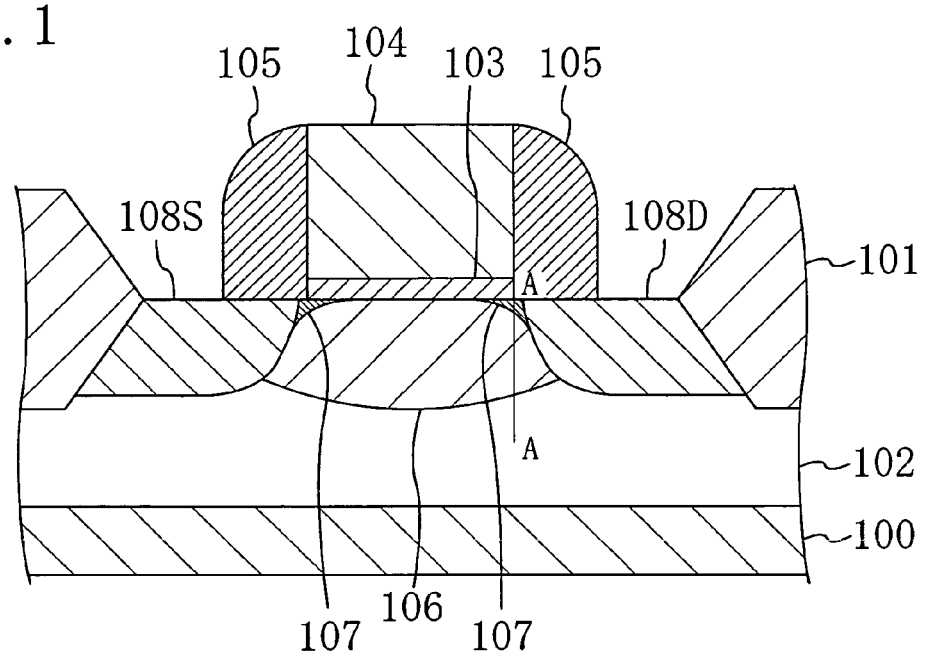
FIG. 1 is a schematic cross-sectional view of a semiconductor device according to an embodiment of the present invention.

Referring to the drawings, an embodiment of the present invention will be described.

FIG. 1 schematically shows a cross-sectional structure of a MIS transistor as a semiconductor device according to the embodiment. As shown in FIG. 1, multiple isolation films 101 composed of silicon dioxide and an N-type well region 102 having a junction surface deeper than the respective bottom surfaces of the isolation films 101 are formed in an upper portion of a semiconductor substrate 100 made of, e.g., P-type silicon (Si).

On each of device formation regions of the principal surface of the semiconductor substrate 100 which are defined by the isolation films 101, there are formed a gate insulating film 103 made of silicon dioxide and having a thickness of, e.g., 6.5 nm and a gate electrode 104 made of polysilicon and having a thickness of, e.g., 280 nm and a gate length of, e.g., 370 nm. On the respective both side surfaces of the gate insulating film 103 and the gate electrode 104, sidewalls 105 made of silicon dioxide or silicon nitride are formed.

In the channel region of the well region 102 which is located below the gate electrode 103, a threshold voltage control layer 106 implanted with arsenide (As) as an n-type impurity is formed. The threshold voltage control layer 106 has an impurity profile with a concentration peak positioned slightly deeper than the surface of the channel region such that a desired threshold voltage, e.g., 0.45 V is provided in the vicinity of the surface at the peak concentration.

In the respective portions of the threshold voltage control layer 106 which are located below the both end portions of the gate electrode 104, LDD regions 107 as p-type extension regions implanted with, e.g., boron (B) are formed. In the respective portions of the well region 102 which are located outside both sidewalls 105, p-type source and drain regions 108S and 108D are formed in connected relation to the threshold voltage control layer 106 and to the LDD regions 107 under the respective sidewalls 105.

Each of the LDD regions 107 according to the present embodiment has an impurity concentration profile with a peak position such that the junction surface between itself and the threshold voltage control layer 106 has an upwardly protruding configuration below either both end portion of the gate electrode 104.

Figure 2:
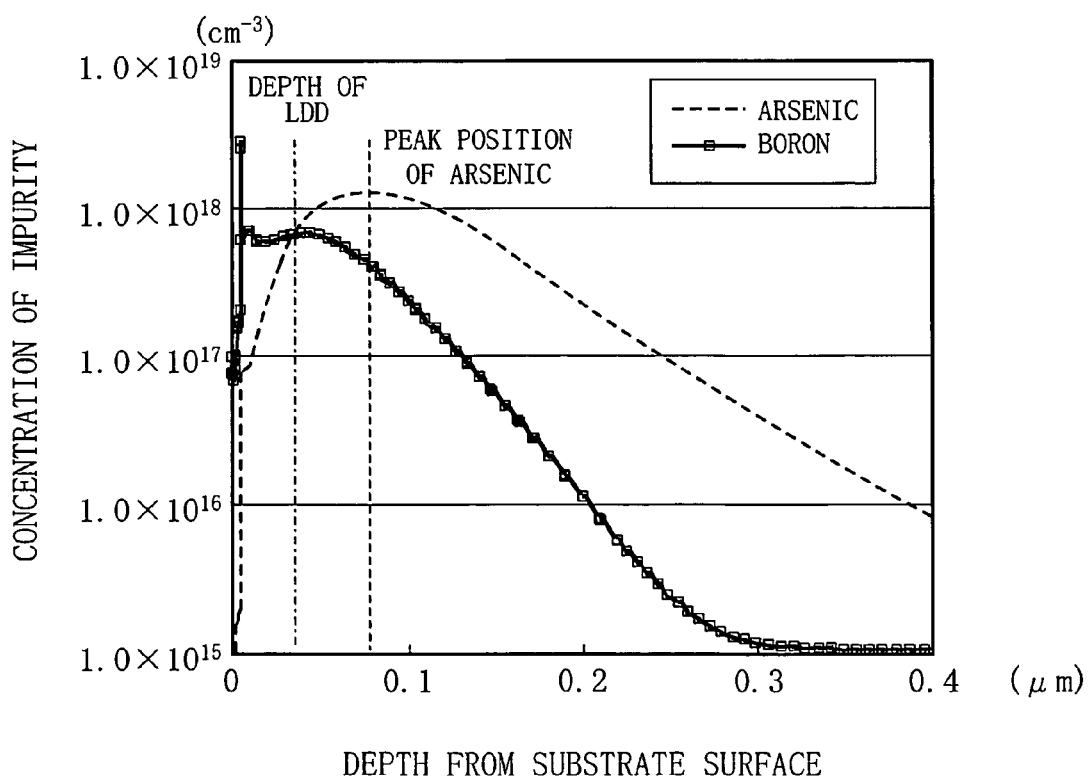
FIG. 2 is a graph showing an impurity profile taken along the line A-A of FIG. 1 in the semiconductor device according to the embodiment.

FIG. 2 shows an impurity concentration profile taken along the line A-A of FIG. 1 in a direction of depth below each of the end portions of the gate electrode after the formation of a transistor. As can be seen from FIG. 2, the junction between each of the LDD regions 107 doped with boron and the threshold voltage control layer 106 doped with arsenic is formed at a depth shallower than the peak position of arsenic after it is diffused in the threshold voltage control layer 106. For example, the peak position of arsenic is at a depth of 80 nm, while the peak position of boron is at a depth of 40 nm.

Thus, the characteristic feature of the present embodiment is that the junction surface between each of the LDD regions 107 and the threshold voltage control layer 106 is formed to have an upwardly protruding configuration below the end portion of the gate electrode 104 through the adjustment of an implant energy and a dose using arsenic to impart the threshold voltage control layer 106 with a steep impurity concentration profile without suppressing the enlargement of the LDD regions 107 by providing pocket implantation regions under the LDD regions 107 as have been provided conventionally.

Figure 3A:
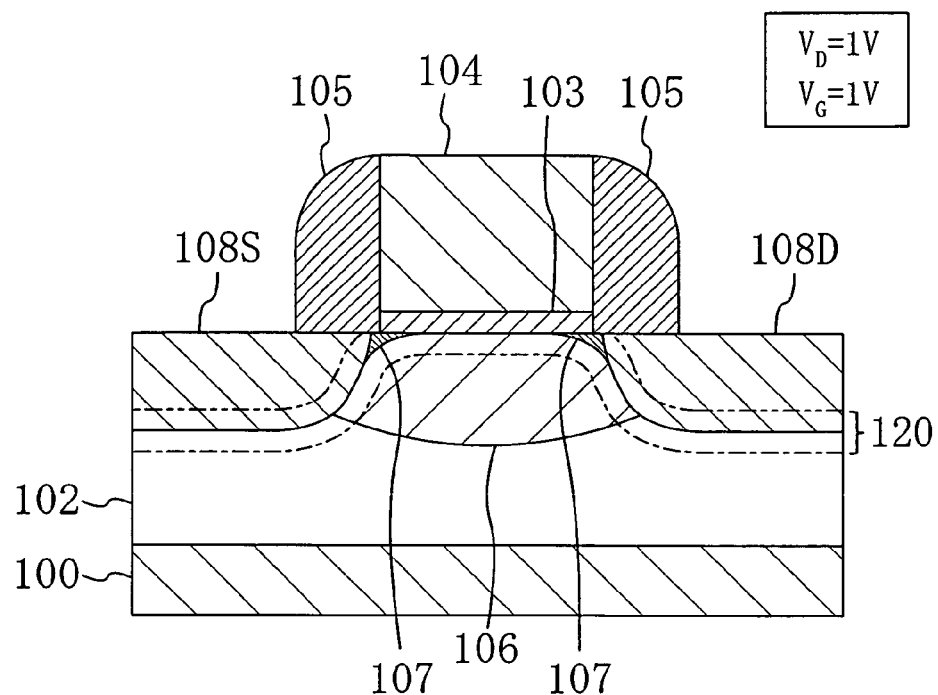
FIGS. 3A and 3B are cross-sectional views each for illustrating the effect of the semiconductor device according to the embodiment.

As a result, when a bias voltage of 1 V is applied to each of the gate electrode 104 and the drain region 108D, the portion of the channel region which is located below the end portion of the gate electrode 104 closer to the drain region 108D is completely covered with a depletion layer 120, as shown in FIG. 3A.

Figure 3B:
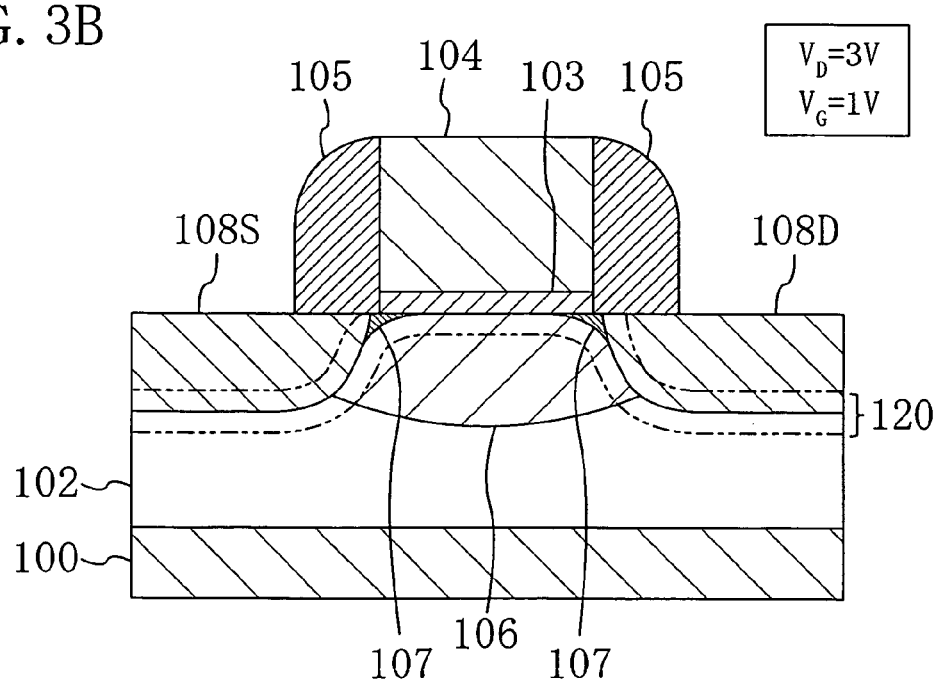

As shown in FIG. 3B, the depletion layer 120 when a bias voltage of 1 V is applied to the gate electrode 104 and a drain bias of 3 V after saturation is applied to the drain region 108D also extends toward the drain region 108D. This allows the suppression of variations in channel length and also allows an increase in the absolute value of an early voltage. Specifically, in a drain current-voltage (I-V) characteristic curve when a gate voltage Vg is 1 V, a GDS value indicative of the gradient (rate of change) of a straight line passing through two points representing a drain current Id1 when a drain voltage Vd is 1 V and a drain current Id2 when the drain voltage Vd is 2 V is reduced so that a high current gain (gm/GDS) is obtainable, where gm is a transconductance. The early voltage indicates a drain voltage at which the foregoing straight line intersects the abscissa axis (Id=0) to define the x-intercept.

Although arsenic (As) having a larger mass number than phosphorus (P) has been used as an n-type impurity doped into the threshold voltage control layer 106, the same effect can be obtained even when antimony (Sb) is used instead.

Although the present embodiment has used a p-type transistor as the MIS transistor, an n-type transistor may also be used instead. When the n-type transistor is used, the threshold voltage control layer 106 may be doped appropriately with indium (In) as a p-type impurity, while the LDD regions 107 may be doped appropriately with phosphorus (P) as an n-type impurity.

A description will be given herein below to a method for fabricating the MIS transistor thus constituted, particularly to a method for fabricating the threshold voltage control layer 105 and the LDD regions 107, with reference to the drawings.

Figure 4A:
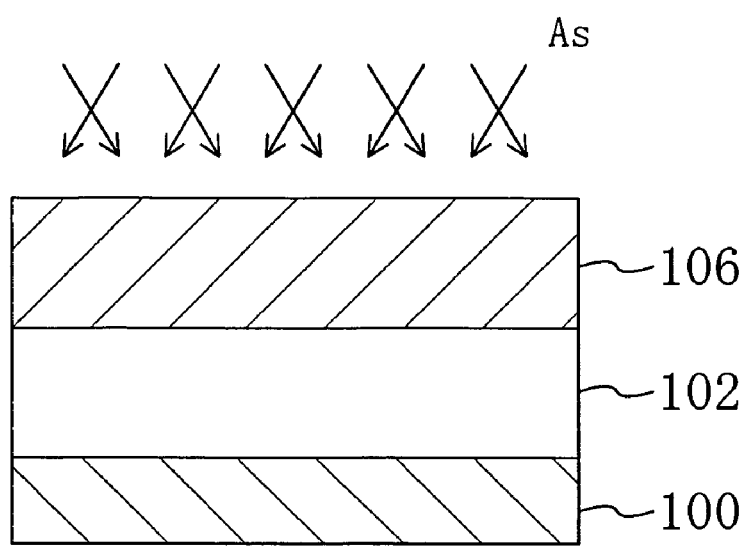
FIGS. 4A and 4B are cross-sectional views illustrating the individual process steps for fabricating an LDD structure in the semiconductor device according to the embodiment in the order in which they are performed.
Figure 4B:
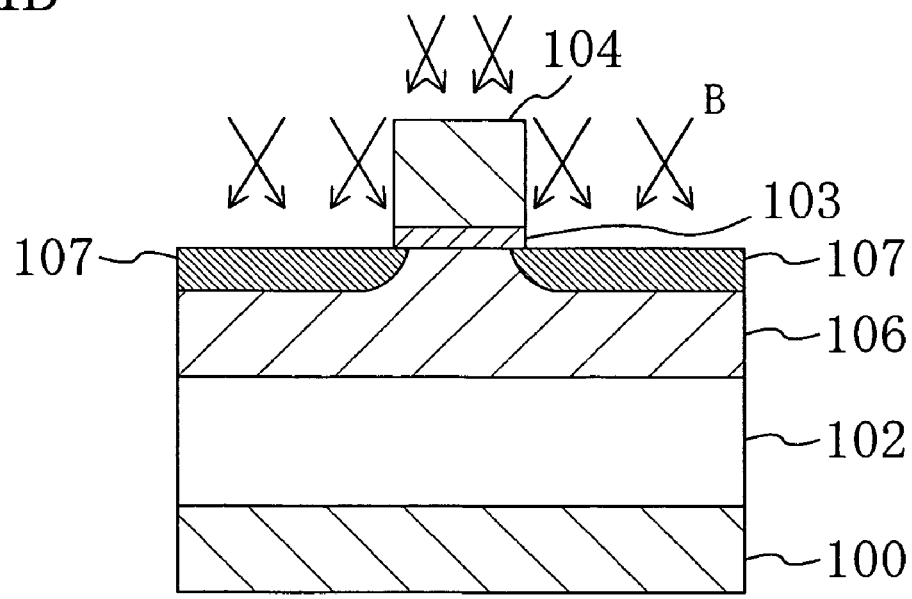

FIGS. 4A and 4B illustrate the step-by-step fabrication method in the ion implantation steps for forming the threshold voltage control layer and the LDD regions in the semiconductor device according to the embodiment.

First, as shown in FIG. 4A, phosphorus (P) or arsenic (As) is implanted into the p-type semiconductor substrate 100, thereby forming the n-type well region 102. Thereafter, an anti-punch-through implant in which arsenic (As) as an n-type impurity is ion implanted at an implant angle (tilt angle relative to a normal line to the principal surface of the substrate) of 7° is performed with respect to the formed well region 102, thereby forming the n-type threshold voltage control layer 106 in the upper portion of the well 102. By setting implant conditions for the threshold voltage control layer 106 such that, e.g., an implant energy is 160 keV and a dose per implant is $4 \times 10^{12}$ ions/cm$^2$, four rotation implants are performed each under the foregoing implant conditions, while changing a rotation angle by 90° for each implant. At this time, the depth of the concentration peak of arsenic from the principal surface of the substrate in the threshold voltage control layer 106 is 80 nm.

Next, as shown in FIG. 4B, a gate insulating film 103 and a gate electrode 104 are formed on the principal surface of the semiconductor substrate 100 formed with the threshold voltage control layer 106. Then, by using the formed gate electrode 104 as a mask, boron difluoride (BF$_2$), which is a fluoride containing boron (B) as a p-type impurity, is ion implanted at an implant angle of 7° so that the p-type LDD regions 107 are formed in the portions of the threshold voltage control layer 106 which are located below the both end portions of the gate electrode 104 and on both sides thereof. By setting implant conditions for the LDD regions 107 such that, e.g., an implant energy is 40 keV and a dose per implant is $2 \times 10^{12}$ ions/cm$^2$, four rotation implants are performed each under the foregoing implant conditions. At this time, the depth of the concentration peak of boron from the principal surface of the substrate in each of the LDD regions 107 is 40 nm.

Next, the sidewalls 105 are formed on the respective both side surfaces of the gate insulating film 103 and the gate electrode 104. Then, by using the gate electrode 104 and the sidewalls 107 as a mask, a p-type impurity such as boron is ion implanted into the threshold voltage control layer 106. Subsequently, a thermal process is performed in a nitrogen atmosphere at a temperature of 850° C. for 45 minutes, whereby the junction surface between each of the LDD regions 107 and the threshold voltage control layer 106 is formed into an upwardly protruding configuration below each of the both end portions of the gate electrode 104, while the source and drain regions 108S and 108D are formed in the portions of the well region 102 which are located outside the threshold voltage control layer 106 and the LDD regions 107, as shown in FIG. 1.

A description will be given herein below to the reason for the upwardly protruding configuration into which the junction surface between each of the LDD regions 107 and the threshold voltage control layer 106 is formed below each of the both end portions of the gate electrode 104.

Although the threshold voltage control layer 106 has been preliminarily formed uniformly below the gate electrode 106, the portions thereof which are located below the both end portions of the gate electrode 104 are damaged by the implant of BF$_2$ in the step of implanting BF$_2$ for forming the LDD regions 107 shown in FIG. 4B. Consequently, arsenic ions that have been doped into the threshold voltage control layer 106 are diffused toward the damaged portions of the threshold voltage control layer 106 which are located below the both end portions of the gate electrode 104. As a result, the concentration of arsenic in the region (in the vicinity of the surface of the channel region) of the threshold voltage control layer 106 which is located immediately below the gate electrode 104 gradually decreases with approach toward the center portion in the gate-length direction of the gate electrode 104. Consequently, in the vicinity of the surface of the channel region, the concentration of boron ions diffused from below the both end portions of the gate electrode 104 toward the center portion in the gate-length direction of the gate electrode 104 becomes higher than the concentration of arsenic ions for threshold control. Accordingly, the junction surface between each of the LDD regions 107 and the threshold voltage control layer 106 is formed into the upwardly protruding configuration below each of the both end portions of the gate electrode 104.

The present embodiment also achieves the effect of allowing the omission of the step for forming conventional pocket implantation regions.

Thus, the semiconductor device and the method for fabricating the same according to the present invention allow complete depletion of even the portion of the channel region which is located below the drain-side end portion of the gate electrode without providing the pocket implantation regions under the extension regions. As a result, a current gain can be improved so that the semiconductor device and the method for fabricating the same according to the present invention are particularly useful for a MIS transistor having an LDD structure in each of extension regions to improve analog characteristics and the like.

What is claimed is:

1. A semiconductor device comprising:
   a well region having a first conductivity type and formed in an upper portion of a semiconductor substrate;
   a gate insulating film and a gate electrode formed successively on the well region of the semiconductor substrate;
   a threshold voltage control layer for controlling a threshold voltage, the threshold voltage control layer being formed in the portion of the well region which is located below the gate electrode and in which an impurity of the first conductivity type has a concentration peak at a position shallower than in the well region;
   an extension region having a second conductivity type and formed in the well region to be located between each of the respective portions of the well region which are located below both end portions in a gate-length direction of the gate electrode and the threshold voltage control layer; and
   source and drain regions each having the second conductivity type and formed outside the extension layer in connected relation thereto, wherein
   a junction surface between the threshold voltage control layer and the extension region has an upwardly protruding configuration, and
   wherein the threshold voltage control layer is in contact with the gate insulating film under a central portion of the gate electrode in the gate-length direction.

2. The semiconductor device of claim 1, wherein the impurity of the first conductivity type to be doped into the threshold voltage control layer is arsenic and an impurity of the second conductivity type to be doped into the extension region is boron.

3. The semiconductor device of claim 1, wherein the impurity of the first conductivity type to be doped into the threshold voltage control layer is indium and an impurity of the second conductivity type to be doped into the extension region is phosphorus.

4. The semiconductor device of claim 1, wherein the junction between the threshold voltage control layer and the extension region below both ends of the gate electrode is at a depth shallower than the peak position of the impurity concentration in the threshold voltage control layer.

5. The semiconductor device of claim 1, wherein the junction surface between the threshold voltage control layer and the extension region is concave relative to the end portions of the gate electrode.

* * * * *

UNITED STATES PATENT AND TRADEMARK OFFICE
CERTIFICATE OF CORRECTION

PATENT NO. : 7,304,350 B2
APPLICATION NO. : 11/410047
DATED : December 4, 2007
INVENTOR(S) : Makoto Misaki It is certified that error appears in the above-identified patent and that said Letters Patent is hereby corrected as shown below:

On the title page

Item (54), and col. 1, lines 1 and 2, change "THRESHOLD VOLTAGE CONTROL LAYER IN A SEMICONDUCTOR DEVICE" to -- A SEMICONDUCTOR DEVICE HAVING A THRESHOLD VOLTAGE CONTROL LAYER --

Signed and Sealed this

Sixth Day of May, 2008

JON W. DUDAS
*Director of the United States Patent and Trademark Office*